United States Patent [19]

Staudacher

[11] Patent Number: 4,500,836
[45] Date of Patent: Feb. 19, 1985

[54] AUTOMATIC WAFER PROBER WITH PROGRAMMABLE TESTER INTERFACE

[75] Inventor: George E. Staudacher, Los Gatos, Calif.

[73] Assignee: Pacific Western Systems, Inc., Mountain View, Calif.

[21] Appl. No.: 202,499

[22] Filed: Oct. 31, 1980

[51] Int. Cl.³ .............................................. G01R 31/02
[52] U.S. Cl. ............................ 324/73 AT; 324/158 R
[58] Field of Search ............ 324/158 F, 158 P, 158 R, 324/73 AT, 73 R; 371/20, 24, 25

[56] References Cited
U.S. PATENT DOCUMENTS 3,963,986 6/1976 Morton et al. .................. 324/158 F
3,970,934 7/1976 Aksu ................................. 324/158 P

*Primary Examiner*—Ernest F. Karlsen
*Attorney, Agent, or Firm*—Harry E. Aine

[57] ABSTRACT

An automatic wafer prober is interfaced with any one of a number of different die testers by storing in memory associated with the wafer prober a plurality of sets of data there being one set of data for each of a plurality of different die testers to be interfaced to the prober. Each set of data defines at least the sense (polarity) of a plurality of test result output signals derived from the particular die tester to be interfaced with the prober. The proper set of stored data is selected by the operator, such as by a digital switch, and a microprocessor employs the selected set of data for modifying the sense of the test result output signals derived from the die tester as fed into the wafer prober so that the die tester output signals as fed into the wafer prober are the same for any one of the plurality of different die tester. In a preferred embodiment, the microprocessor generates a test start signal which is outputted from the prober to the die tester. The pulse width of the test start signal as required by the particular die tester is stored in the set of data determinative of the polarity of the test result signals and is selected and employed by the microprocessor for selecting the proper pulse width of the test start signal.

4 Claims, 18 Drawing Figures

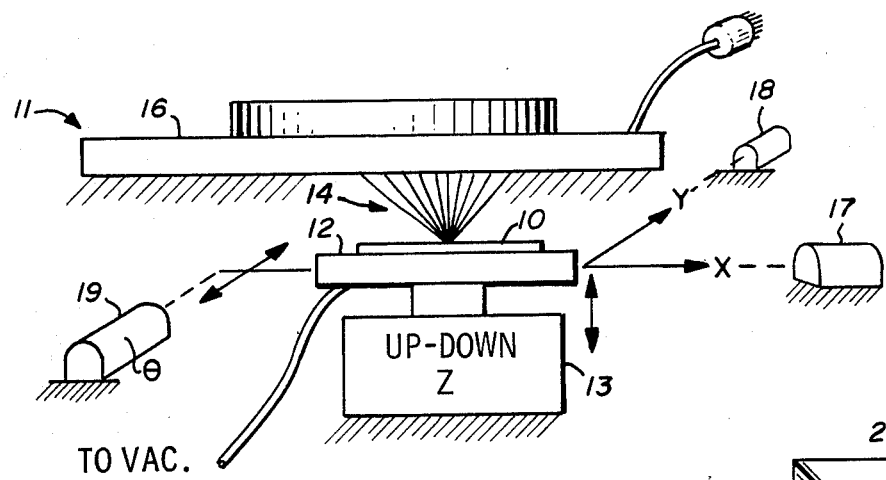
Fig_1
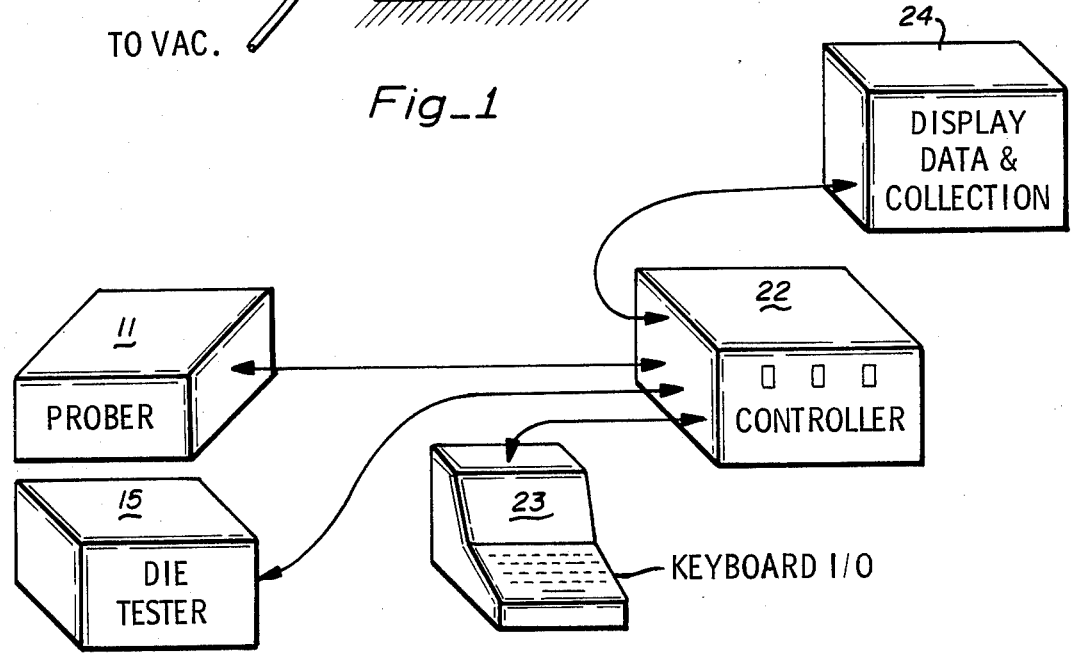
Fig_2
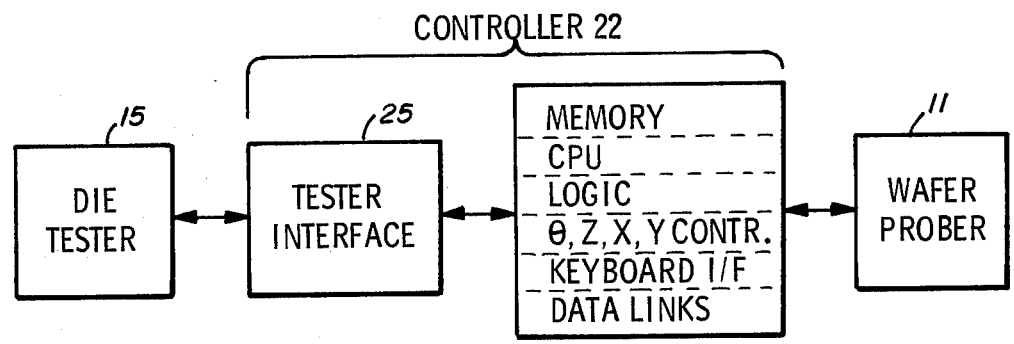
Fig_3

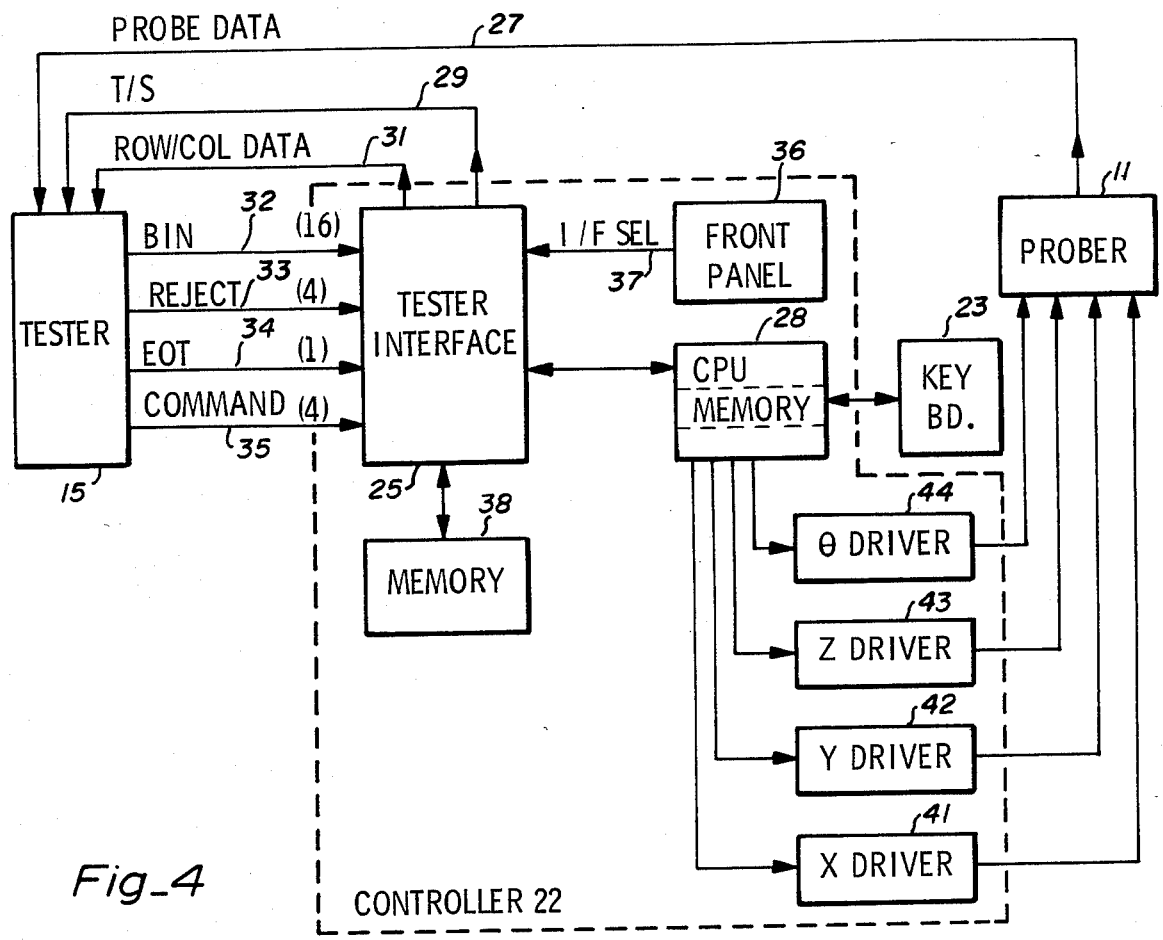
Fig_4
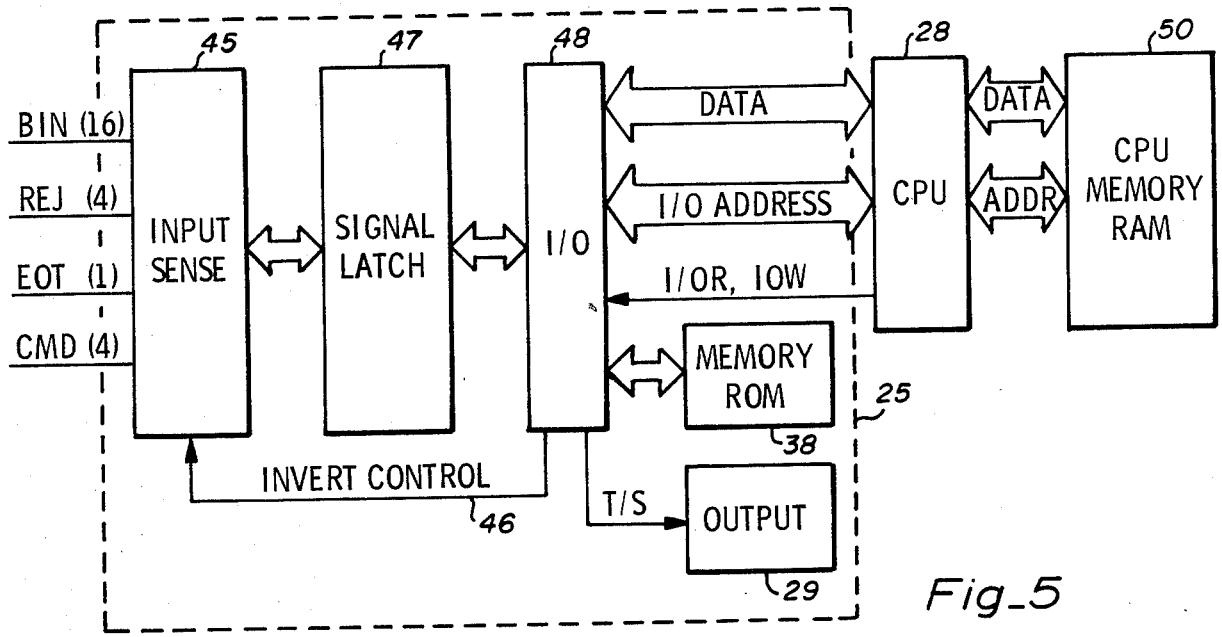
Fig_5

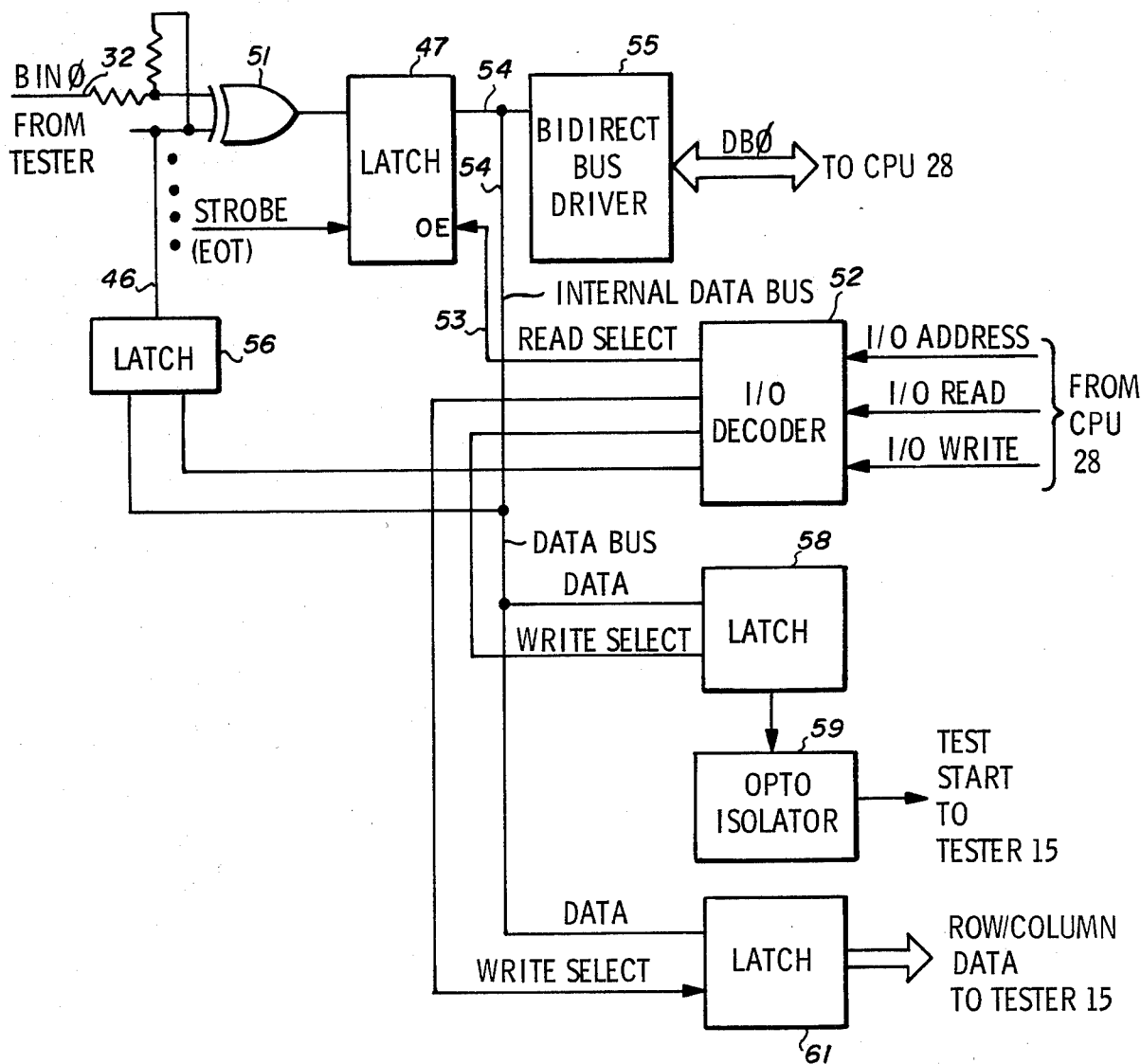
Fig_6
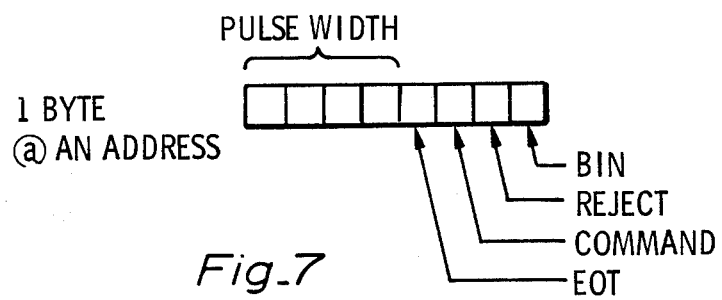
Fig_7

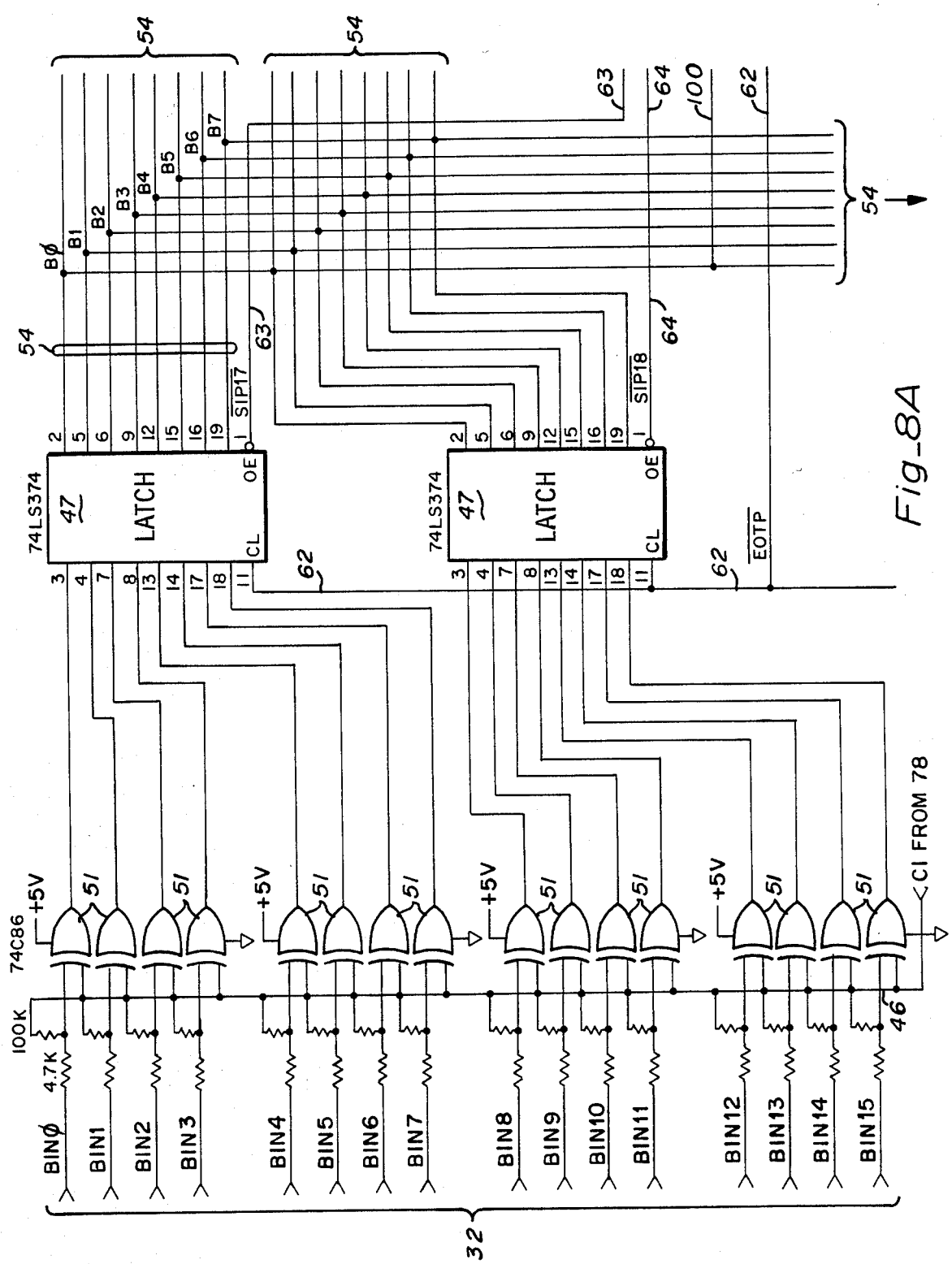
Fig_8A

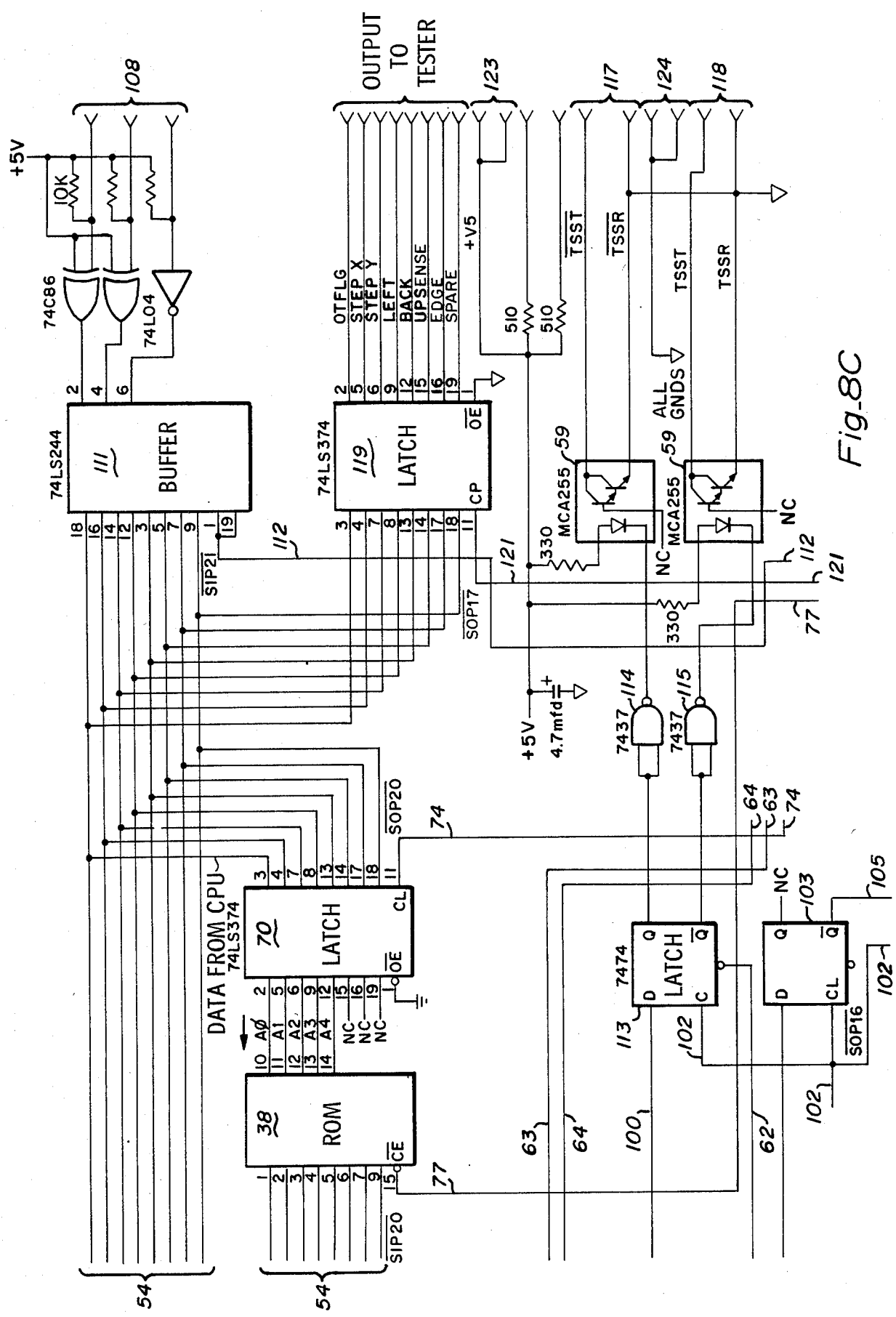

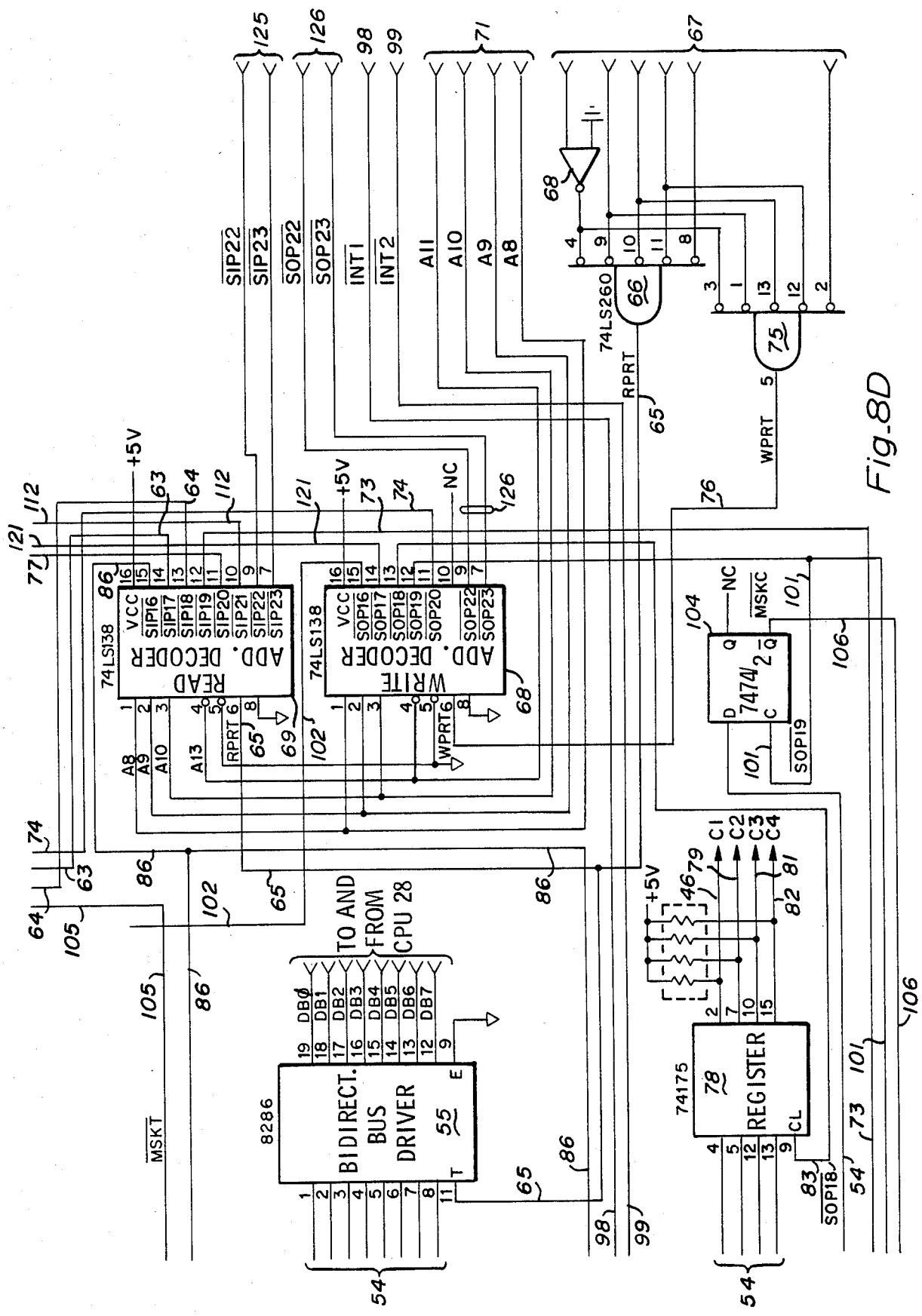

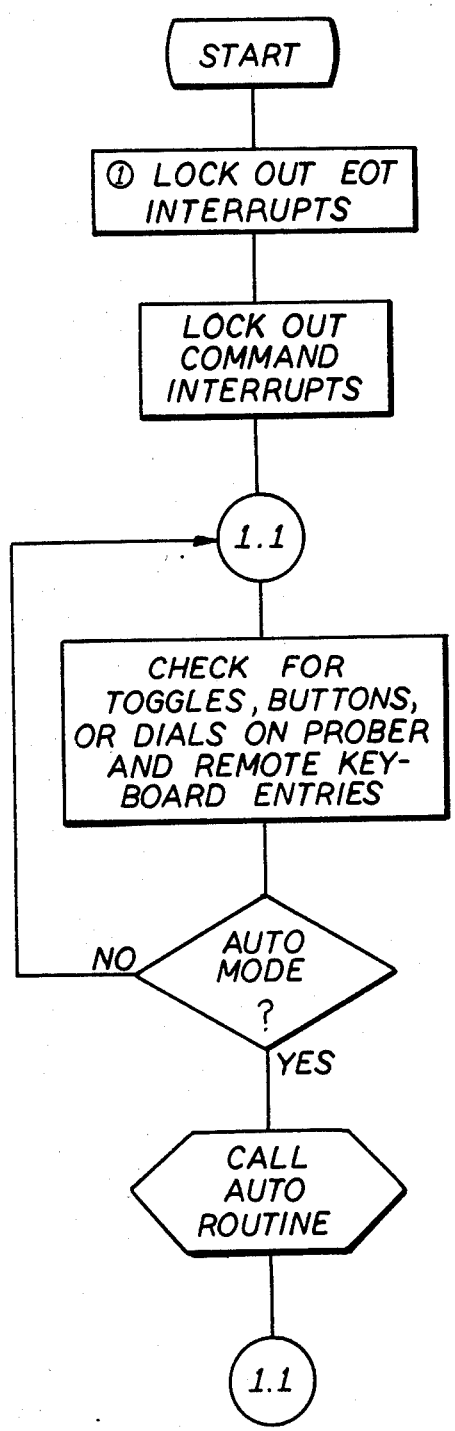
Fig_9A
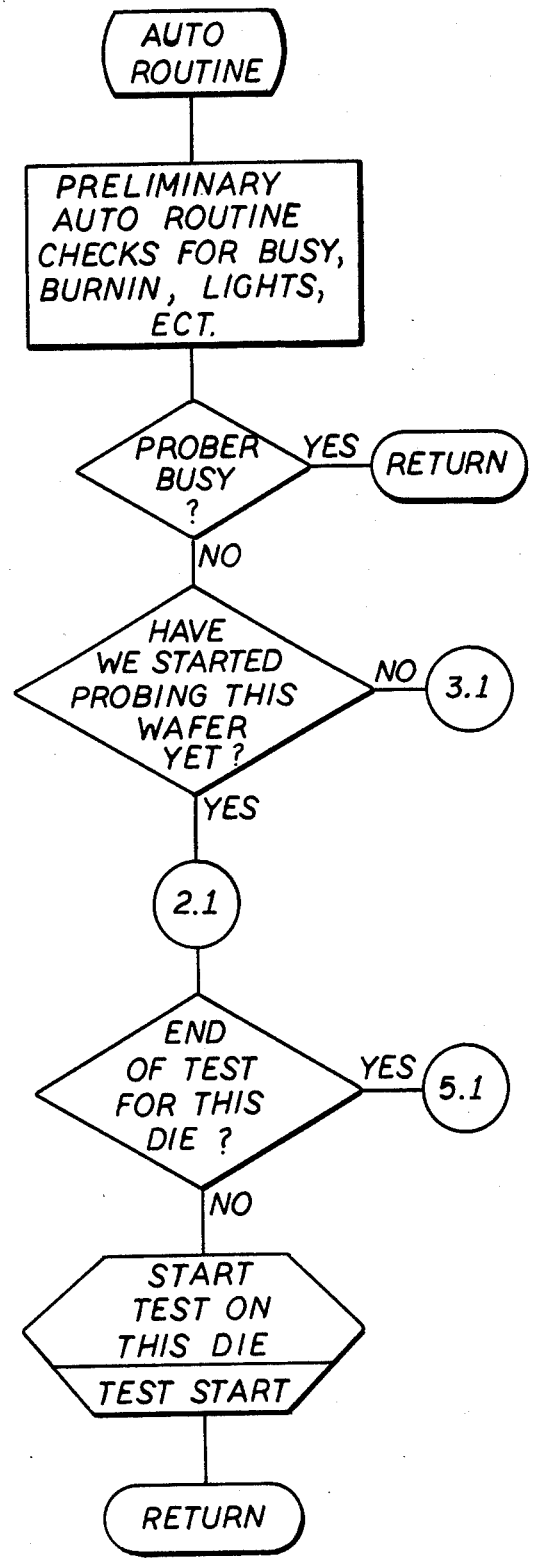
Fig_9B

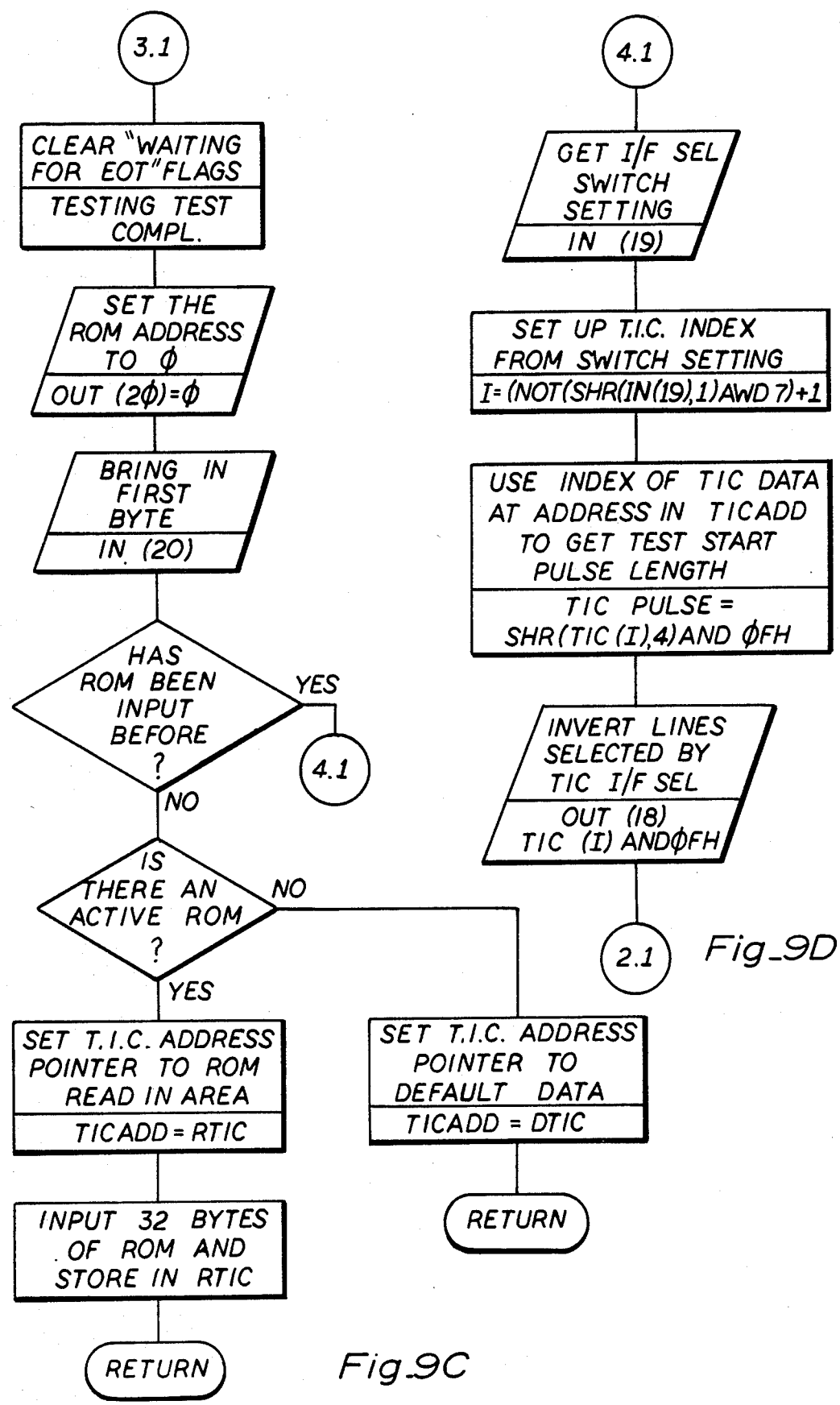

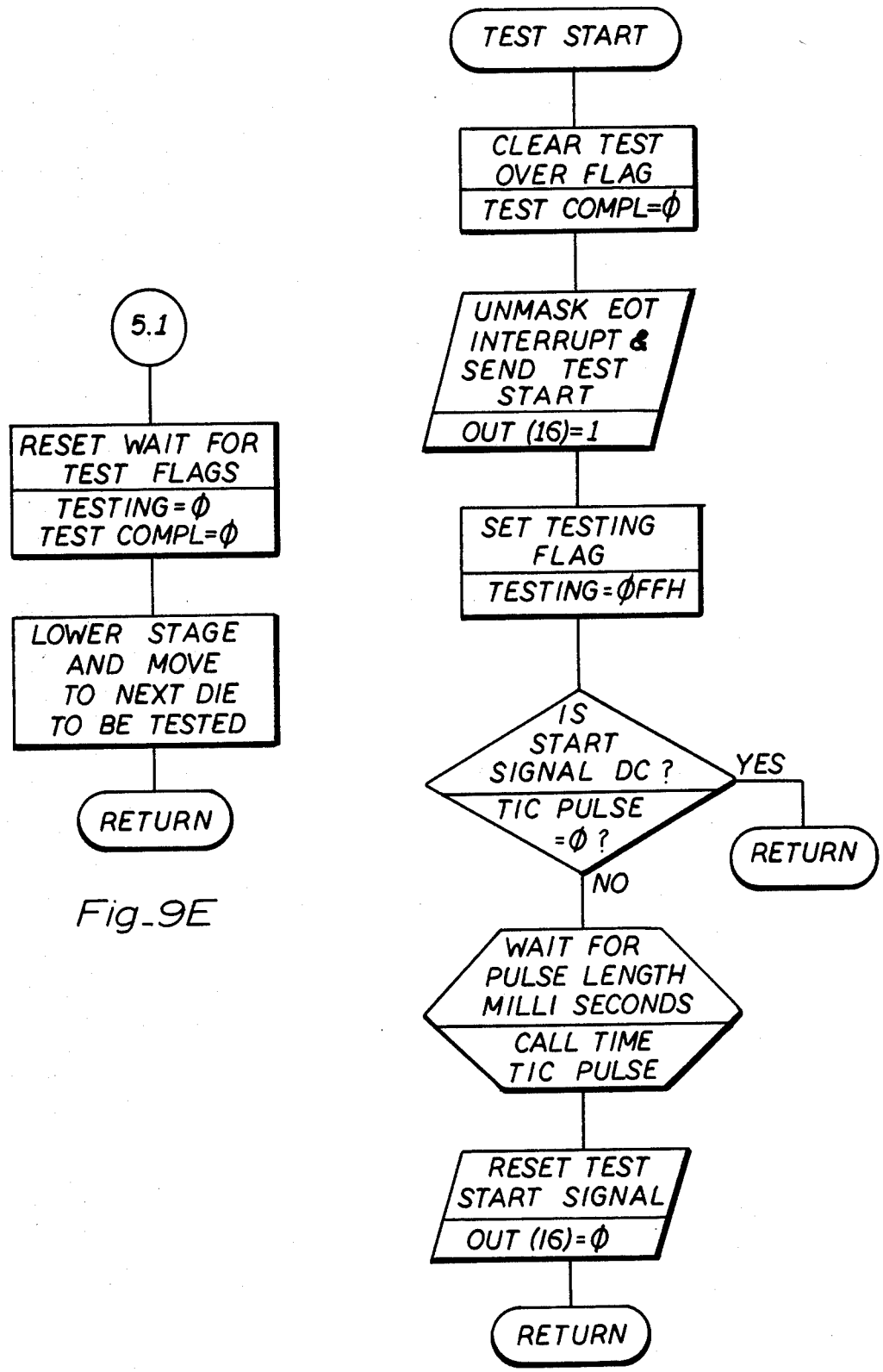
Fig_9E
Fig_9F

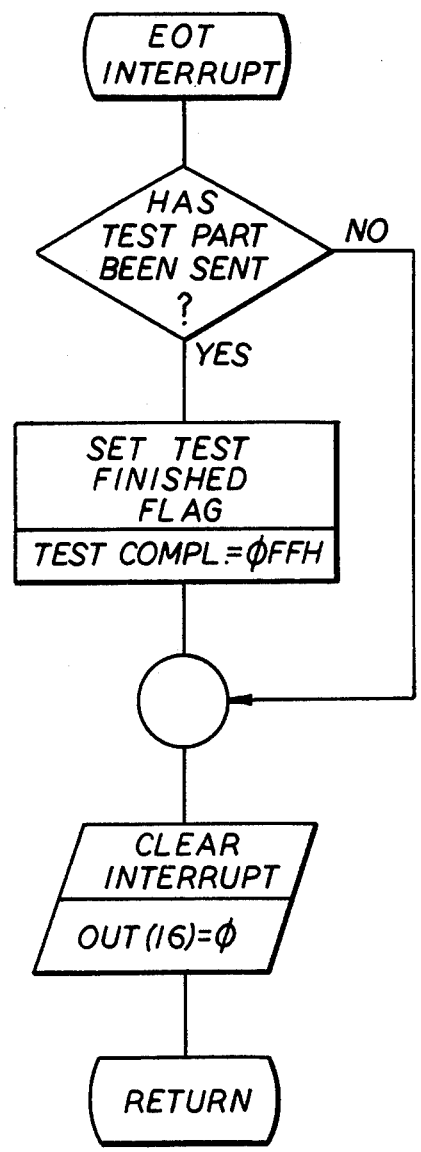
Fig_9G

AUTOMATIC WAFER PROBER WITH PROGRAMMABLE TESTER INTERFACE

BACKGROUND OF THE INVENTION

The present invention relates in general to automatic wafer probers and, more particularly, to an improved automatic wafer prober which includes a programmable die tester interface such that the interface will interface the particular wafer prober to a plurality of different die testers.

DESCRIPTION OF THE PRIOR ART

Heretofore, automatic wafer probers have included interface circuitry for interfacing the wafer prober with different die testers having different polarities of output test result signals fed from the die tester to the wafer prober. Such test result signals are usually for inking or rejecting die on the wafer failing to meet the test of the tester.

In one prior art system, the automatic wafer prober included an interface circuit board having at least two sets of input terminals to receive each of the output lines derived from the die tester, there being one set of terminals for positive polarity type logic output signals derived from the tester and there being another set of terminal for a negative polarity type output logic. The technician selected the proper terminal on the interface circuit board and electrically connected it to the corresponding line coming from the tester. An example of such a prior art interfacing scheme is that employed in the model 1034 prober which is commercially available from Electroglas of Santa Calra, Calif.

A second prior art scheme for interfacing an automatic wafer prober to a plurality of different die testers included a set of different interface circuit boards, one board for each different die tester. The operator would select the proper interface circuit board and install that particular circuit board in the prober for interfacing the prober to the particular die tester. An example of this type of system is that employed in the model SP1 automatic prober commercially available from Pacific Western Systems, Inc. of Mountain View, Calif. One problem with such a system is that as many as 30 different interface circuit boards are required for interfacing the prober to different die testers.

SUMMARY OF THE PRESENT INVENTION

The principal object of the present invention is the provision of an improved method and apparatus for interfacing an automatic wafer prober with a plurality of different die testers.

In one feature of the present invention, a plurality of sets of data, one set for each of the plurality of different die testers, is stored in a memory associated with the automatic wafer prober such that the operator can select a certain predetermined set of data corresponding to the die tester to be interfaced to the prober and the wafer prober utilizes the selected data for modifying the sense of the test result output signals derived from the die tester so that the prober need operate with only one sense of logic for the plurality of different die testers employing different polarity test result logic.

In another feature of the present invention, these sets of data stored in the memory of the wafer prober includes data relative to the test start pulse width to be supplied from the wafer prober to the particular die tester to initiate test of a particular die. The wafer prober employs the stored data for determining the pulse width of the test start signal fed from the wafer prober to the die tester to initiate test of the die, whereby the wafer prober will operate with a plurality of different die testers employing different pulse widths of the test start signal.

Other features and advantages of the present invention will become apparent upon a perusal of the following specification taken in connection with the accompanying drawings, wherein:

BRIEF DESCRIPTION OF THE DRAWINGS

FIG. 1 is a schematic diagram, partly in block diagram form, of a wafer prober of the type to be employed in the preferred embodiment of the present invention, FIG. 2 is a schematic block diagram of a wafer probing and die testing apparatus incorporating features of the present invention, FIG. 3 is a schematic block diagram depicting the tester/prober interface incorporating features of the present invention, FIG. 4 is a schematic block diagram of the system of FIG. 3 in somewhat greater detail, FIG. 5 is a schematic block diagram of a tester/prober interface incorporating features of the present invention, FIG. 6 is a schematic block diagram depicting one input line from the tester and the circuits associated with the tester/prober interface circuit of FIG. 5, FIG. 7 is a schematic diagram of one byte of memory at a given address and corresponding to one set of data for interfacing a particular tester to the prober, FIGS. 8A, B, C, and D, are the top left, bottom left, top right and bottom right quadrants respectively of a schematic circuit diagram for the prober/tester interface depicted in FIG. 5, and FIG. 9A–G is the logic flow diagram for that portion of the computer program relating to interfacing the test result signals and test start signals between the tester andd the prober and incorporating features of the present invention.

DESCRIPTION OF THE PREFERRED EMBODIMENT

Figure 8B:
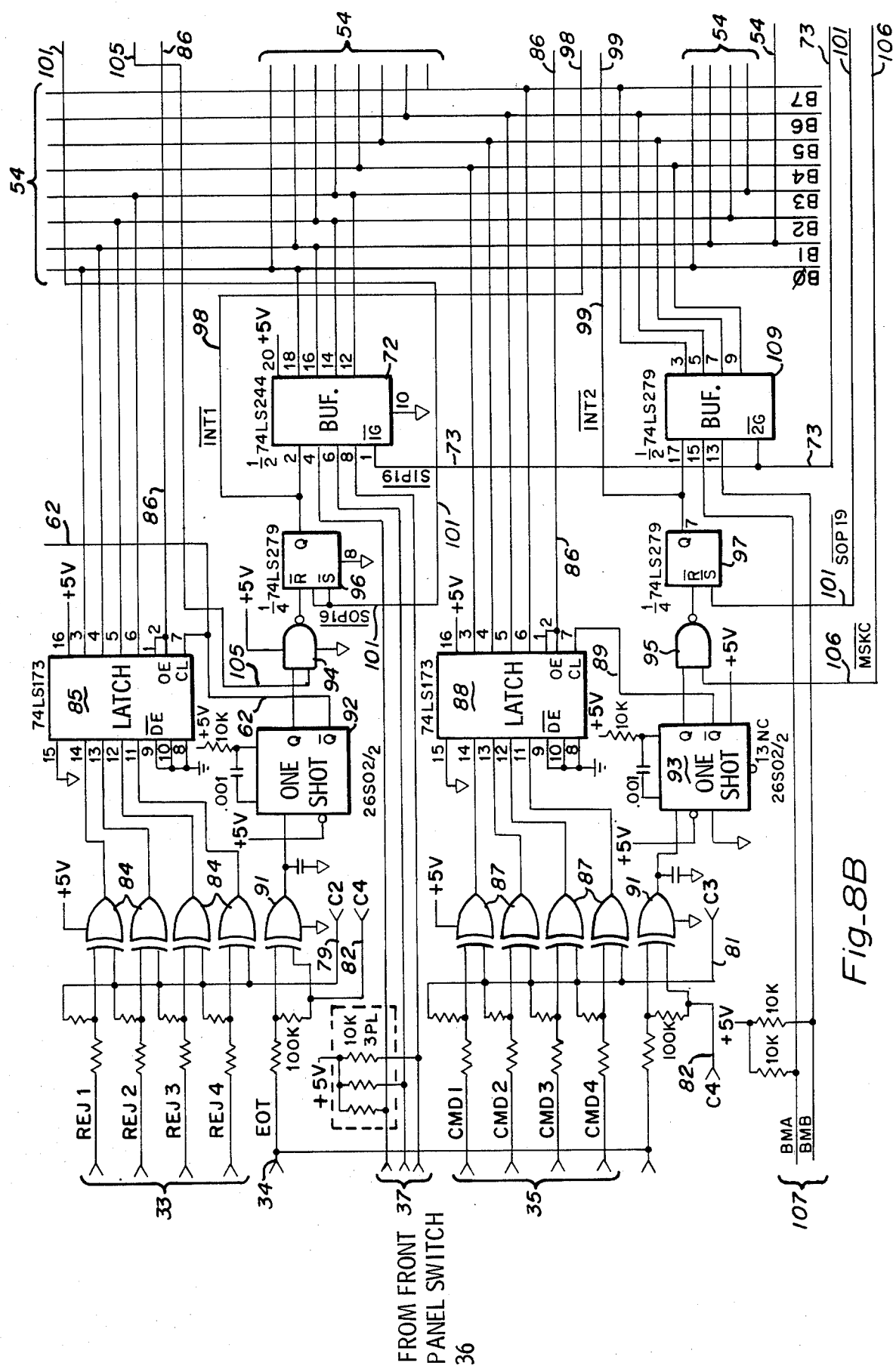

Referring now to FIGS. 1 and 2 there is shown an automatic wafer prober 11 for electronically testing discrete devices, such as integrated circuits, light emitting diodes, etc. while still in the wafer form. Automatic wafer probers 11 are well known commercially available machines, such as that described in U.S. Pat. No. 3,996,517 the disclosure of which is hereby incorporated by reference as though fully set forth hereat. They normally mark the defective electronic device or die in some manner, usually with a solenoid operated inker of some variety. The marked die is later discarded or sorted for grade in accordance with the color of ink. The usual sequence of events is for a vacuum chuck 12 on which the wafer 10 to be tested is mounted, to be raised up in the vertical or Z axis direction under the influence of a pneumatic cylinder of solonoid 13. The individual die to be tested is electrically connected through a number of spring loaded needle like probes 14 to a die tester 15.

A surface sensor, not shown, makes contact with the wafer surface and via digital logic circuitry provides the signal for the tester 15 to begin its test sequence. The test sequences are developed in the tester 15 which is external to the prober 11 and through electrical connections to the probes 14 on their support ring 16 it applies the test signals to the die under test and monitors the die's response to the test sequence. If a defective die is found it is marked by an electrical signal being fed back to the prober 11 from the tester 15 to actuate an inking probe to mark the die accordingly. If a defective die is found it is discarded in a later processing step which cuts up the wafer and separates the numerous die formed on its surface.

Upon completion of the test of a die, an end of test (EOT) signal is passed from the tester 15 to the prober 11 causing the vacuum chuck 12 to drop to its lower limit allowing indexing of the wafer in the X and Y directions to the next die on the wafer at which point the next test sequence is initiated. X and Y motors 17 translate the chuck 12 in the row and column direction, respectively, to bring the next die under the pattern of probing needles 14. Also, the chuck is rotatable around the Z axis, i.e., in the θ direction, by means of a motor 19. A microscope (not shown) disposed over the ring of probes 14 permits the operator to observe the wafer 10 for initial alignment of the die test pad patterns relative to the individual probe pattern.

The prober 11 includes a controller 22 which interfaces the tester 15 to the prober 11. The controller 22 includes a keyboard input output device 23 which permits the operator to command certain operations of the prober 11. Also, a display and data collection system 24, which may include a printer, is interfaced to the tester via the intermediary of the controller such that the test results may be collected and displayed, as by wafer mapping.

Referring now to FIG. 3 there is shown the controller 22 in somewhat greater detail. Briefly, the controller 22 includes a tester interface 25 for interfacing the tester 15 to the remaining portion of the controller 22 which includes its memory, a central processing unit such as a microprocessor, its logic, theta, Z, X and Y control drivers, the keyboard interface and data links.

Referring now to FIG. 4 the controller 22 is shown in slightly greater detail. More particularly, the probe data is directed from the prober 11 to the tester 15 over probe data lines 27. A test start signal is fed from the tester interface via line 29 to the tester 15 to initiate the test sequence for a particular die on the wafer. Also, row/column data is supplied from the tester interface 25 to the tester 15 via lines 31 so that the location of the die under test is inputted to the tester 15.

The test result output of the tester 15 includes at least four sets of lines. A first set of lines 32 is a bin set consisting of 16 individual output lines. The data as supplied from the tester 15 to the tester interface 25 on the 16 bin lines 32 comprises the classification of the test results for the given tested die. This information which is inputted to the tester interface 25 is then passed from the tester interface 25 into the central processor unit 28 for classification of the particular die.

In addition there are four command lines 35 outputting from the tester 15 to the tester interface 25 for inputting certain commands from the tester 15 to the prober 11.

Also, there are four reject output lines 33 from the tester 15 which are inputted to the tester interface 25 for commanding certain inking patterns for inking the die on the wafer.

Furthermore, there is one end of test output line 34 (EOT) which is inputted to the tester interface 25 for signalling the end of the test sequence for a given die.

The controller 22 includes a front panel 36 having three multi-position switches thereon. These switches are coupled to the tester interface 25 via a plurality of sets of lines. One set of lines is an interface select set of three lines 37 which inputs to the tester interface 25 a preselected address for addressing in a memory 38 coupled to the tester interface or in the CPU a certain byte of memory having eight bits (see FIG. 7), the first four bits of which define the pulse width of the test start signal 29 required by the particular tester. The next four bits include one bit for each of the sets of tester output lines 32, 33, 34 and 35 such individual bits being a "1" or "0" in accordance with the sense of the logic outputted from the tester 15. More particularly, the tester interface 25 acting together with its CPU 28 is configured for interfacing the prober 11 to a plurality of different testers 15, each tester having a different set of logic, i.e., positive true or negative true logic for each of the respective output lines 32–35.

In the memory 38 associated with the tester interface 25 and/or in the memory of the CPU a plurality of bytes of memory, as aforedescribed are provided, one byte for each of a plurality of the different possible testers 15 that may be interfaced with the prober 11. The operator identifies the particular tester 15 to be interfaced with the prober 11 and from the front panel switch 36 selects a given particular byte of the memory corresponding to that particular tester. The tester interface 25, in cooperation with the CPU adjusts the sense of the signals inputted from the tester 15 to the tester interface 25 so that the controller 22 sees only one type of logic. The test result logic from the tester 15 is thus modified by the interface select switch 36 to be compatible with the prober logic.

At the end of test, the end of test signal (EOT) arrives from the tester at the tester interface 25. Thereafter the CPU 28 outputs signals to the X, Y and Z drivers 41, 42, and 43 for moving the chuck 12 to the position of the next die on the wafer 10 to be tested and then the CPU 28 generates a test start signal which is fed via the tester interface 25 to the tester 15 to initiate the next test cycle.

Referring now to FIG. 5 there is shown a schematic diagram of the tester interface 25. The input lines 32–35 from the tester 15 are fed into an input sense network 45 which senses whether the input line is a logic one or zero. The input sense also includes an invert control set of lines 46 there being one line for each of the sets of input lines 32–35 to invert the sense of the input signals as required to properly interface the logic of the particular tester 15 to the logic of the prober 11. The output signals derived from the input sense network are strobed into respective latch networks 47 wherein they are latched for subsequent interrogation by an input/output circuit 48 as addressed from the CPU 28. More particularly, the CPU 28 selectively inputs the respective latched test result signals via an internal data bus for processing of the data. A memory 38 in the tester interface 25 is also addressable by the CPU to derive the data relative to the sense of the logic of the input signals derived from the particular tester 15. At end of the test, the CPU 28 outputs a test start signal via the input/output network 48.

Referring now to FIG. 6 the tester interface circuit 25 of FIG. 4 is depicted in somewhat greater detail. More particularly, the output from the tester 15, coming over one of the 16 bin lines 32 is fed into one input of an exclusive OR gate 51. The output of the exclusive OR gate is strobed via the EOT signal to one input of a latch 47 which serves to hold the particular data bit derived from the output of the exclusive OR gate. When the CPU program directs it to read the output from the various bin lines 32, the respective latch 47 is addressed by the CPU 28. The address from the CPU 28 is fed to a decoder 52 wherein it is decoded and a read select output is derived from the decoder 52 on line 53 and fed to the output enabled terminal of the latch 47 which causes the addressed information to be outputted from the latch 47 onto an internal data bus 54 whence it is fed into the CPU 28 via a bidirectional bus driver 55.

Before the EOT signal, the CPU 28 reads the address outputted from the panel switch 36 for addressing the selected interface byte of memory (see FIG. 7). The computer reads the four bits relative to the tester logic sense onto the data bus 54 via the bidirectional driver and thence strobes it into a latch 56 which produces an invert control signal on output line 57 for inverting, as necessary, the signals received on the bin lines 32.

When the CPU's program directs it to produce a start test output to the tester 15, it inputs data onto the data bus 54 and thence it is written into a latch 58 to initiate the start of the test start output pulse.

The CPU, in response to the pulse width data and in a period of time after the first input to the latch 58, as determined by such pulse width data, inputs an opposite polarity bit to the latch 58 to stop the test start pulse.

Similarly, the CPU 28 inputs via the bidirectional bus driver 55 and internal data bus 54 row and column data to a latch 61 which is then addressed via the input/output decoder 52 to produce a write select input to latch 61 which then outputs the row column information to the tester 15.

Referring now to FIGS. 8A–D, there is shown the prober/tester interface circuit 25. The 16 bin lines 32 are each inputted to respective exclusive OR gates 51. The outputs of the OR gates 51 are strobed by the end of test signal (EOT) on line 62 into a pair of latches 47. A suitable latch is model 74LS374 available from Texas Instruments. The bin signals stored in the respective latches 47 are inputted to the CPU 28 via internal bus 54 and bidirectional bus driver 55 in response to read select inputs on line 65 and address signals on lines 63 and 64. The bus driver 55 is enabled by a read select input derived via line 65 connected to the output of a read decoder 66 comprising a NOR gate, such as a 74LS260 commercially available from Texas Instruments. The read decoder 66 is addressed via five address input lines 67 connected to the output of the CPU 28. One of the lines 67 has an inverter 68 therein. The address signals for addressing the latches 47 on line 63 and line 64 are derived from a read address decoder 69, such as a 74LS138 commercially available from Texas Instruments. The address inputs to the read address decoder 69 are derived from an address bus 71 connected to the output of the CPU 28.

The invert control signal 46 for the bin lines 32, as previously described with regard to FIGS. 4 through 6, is derived from the front panel select switch 36 feeding digital address data in on three lines 37. The lines 37 are inputted to a buffer amplifier 72 and thence inputted to the CPU 28 via the internal data bus 54 and bidirectional bus driver 55 in response to an addressed read select input on line 73 derived from the read address decoder 69 in response to an input on the address bus 71 from the CPU 28.

In the CPU, the information derived from the front panel select switch 36 on lines 37 corresponds to one of eight possible addresses, namely, the address selected on the front panel switch 36. This address is one byte of data as shown in FIG. 7 comprising four bits of pulse width data for the test start signal and four bits of data relative to the sense or polarity of the input signals received on the bin, reject, command, and end of test lines respectively received from the tester 15. The CPU 28 has two memories to interrogate relative to the selected address. One of the memories is its own random access memory 30 (see FIG. 5) which has stored therein eight bytes corresponding to eight possible interface selections, each byte having an address corresponding to one of the addresses selectable by the front panel select switch 36. The second memory is the read only memory 38 associated with the tester interface 25 with its output coupled to the internal data bus 54. A suitable read only memory is a 6331 commercially available from Monolithic Memory Inc., of Santa Clara. The memory 38 has 32 addresses, the first eight corresponding to the information indicated in FIG. 7 relating to the tester interface select. The memory 38 is addressed by means of a transparent latch 70, such as a 74LS374 commercially available from Texas Instruments. The CPU 28 addresses the memory 38 by inputting an address code to the transparent latch 70 from the internal data bus 54, such information being put onto the data bus from the CPU 28 via the bidirectional bus driver 55 in response to a read signal derived from the read decoder 66 over line 65. The selected address information is fed via five lines from the transparent latch 70 to the read only memory 38. The address is outputted to the memory 38 via a write signal fed to the transparent latch on address line 74 derived from a write address decoder 68 having its input coupled to the address bus 71 to receive the address code from the CPU 28 and to a write input derived over line 76 from a write decoder 75. The write signal is derived from the write buffer decoder 75 in response to a write signal derived from the CPU 28 over bus 67 coded in such a manner as to produce a write output on NOR gate forming the decoder 75.

The CPU 28 first checks to see if the memory 38 is programmed or is present by reading a selected address in the memory 38 onto the internal data bus 54 in response to a read signal applied via line 77 to the memory 38 and derived from the output of the read address decoder 69 addressed and read out in the manner as previously described. If the CPU finds that there is data stored in the memory 38 it elects to use that addressed data as opposed to the other similarly addressed data in its own random access memory.

The memory 38 permits the user to insert his own sets of tester interface data thereby permitting the user to customize the prober to his own special requirements as opposed to using the standard interface sets of data provided in the CPU memory by the manufacturer.

The elected memory at the selected address is then read out onto the internal data bus 54 and inputted to a register 78, such as a 74175 available from Texas Instruments. The contents of the register 78 corresponds to the proper inverter control signals for controlling inversion of the bin, reject, end of test, and command input lines from the tester 15. The contents of the register 78 are outputted on respective control lines 46, 79, 81 and 82 of the exclusive OR gates including OR gates 51 controlling the bin line logic. The contents of the register 78 are written by means of a write address output signal derived from the write address decoder 70 via line 83.

The reject output lines 33 from the tester 15 are fed into exclusive OR gates 84 and strobed into a latch 85 in response to an EOT signal on line 62. A suitable latch is a 74LS173 commercially available from Texas Instruments. The contents of the latch 85 are read out onto the internal data bus 54 in response to a read address signal on line 86 derived from the read address decoder 69 in response to read and address outputs on buses 71 and 67. The reject data read into the internal bus 54 is thence read into the computer 28 via the bidirectional bus driver 55 in response to a read signal on line 65.

The command output signals from the tester 15 are fed via the command lines 35 into the inputs of exclusive OR gates 87 and thence into a latch 88 in response to an EOT strobe signal on line 89. The contents of the latch 88 are read onto the internal data bus 54 via a read signal applied to the previously described reject latch 85 on line 86. Once on the data bus 54, the command signals are read into the CPU 28 via the bidirectional bus driver 55. The CPU responds to the various command inputs received on the command lines 35 and outputs control signals as dictated by the command input lines 35.

The EOT signal is supplied to the tester interface circuitry 25 via tester output line 34. Output line 34 is connected to the input of a pair of exclusive OR gates 91 the outputs of which are fed to the input of respective one shot multivibrators 92 and 93 to produce output EOT pulses on strobe lines 62 and 89 respectively. Another output of the one shots 92 and 93 is fed to the input of respective NAND gates 94 and 95. The outputs of NAND gates are fed to respective latches 96 and 97 to produce interrupt output signals on lines 98 and 99, respectively. The interrupt outputs 98 and 99 are fed to the CPU 28 for interrupting the operation of the CPU to indicate the EOT signal.

If the CPU 28 is programmed so as not to be interrupted by the EOT signal, it addresses over bus 71 and provides a write address over bus 67 to the write address decoders 68 and 75 for outputting write address signals on lines 101 and 102 directed to latches 103 and 104 to write disable output signals on lines 105 and 106 which are fed back to respective NAND gates 94 and 95 to disable the interrupt outputs in lines 98 and 99, respectively.

Certain inking patterns, i.e., inking delay and pairs of inking probes to be actuated defining various inking patterns have the data determinative of each of the various inking patterns entered in bytes of memory which can be either in the random access memory of the CPU 28 or provided at memory address locations in the interface memory 38. These particular inking options are selected by inking select switches on the front panel 36, with the output of the switch positions being fed via address lines 107 and 108, respectively to the interface circuit 25.

These inking addresses are inputted to the internal data bus 54 via buffers 109 and 111 in response to read signals on read address lines 73 and 112, respectively. The read signals are produced in response to address and read signals applied to the interface circuit 25 via address bus 71 and read-write bus 67 leading from the CPU 28. Once the inking address data is inputted onto the data bus 54 it is fed to the CPU 28 via the bidirectional bus driver 55.

In the CPU 28 the ink delay address information is utilized for addressing the read only memory 38 associated with the tester circuit, if present, otherwise the random access memory of the CPU 28 is addressed to derive the data determinative of the ink delay and pattern which is thence outputted from the CPU 28 to the respective inking probes for controlling the inking thereof.

With respect to generation of the test start signal outputted from the CPU 28, one output of the EOT signal derived on line 62 is fed to the reset terminal of a latch 113 for enabling the latch after the previous output.

The latch 113 is turned on by a bit of data derived on input line 100 from the CPU 28 via the bidirectional bus driver 55 and internal data bus 54. The latch 113 is turned off, i.e., switched to the other logic state by a second bit of data derived on input line 100 from the CPU 28. These two bits of data are written into the latch 113 in response to a write signal on line 102 after being read onto the data bus 54 via a read signal on line 65. The CPU 28 determines the period of time between the two input bits to latch 113 in response to its program which decodes the four pulse width bits at the addressed byte of memory, as described above relative to generation of the tester interface inverter control signals for the bin, reject, EOT and command lines 32-35.

The output of latch 113 is fed to a pair of inverter buffers 114 and 115. The outputs of the inverter buffers 114 and 115 are fed, respectively, to a pair of optoisolators 59. One of the optoisolators 59 produces a negative polarity test start signal on output terminals 117 and the other optoisolator produces a positive polarity test start signal on output lines 118.

If the tester 15 requires a negative polarity test start signal it is connected to the prober interface circuit 25 via output lines 117. On the other hand if the tester 15 requires a positive polarity test start signal the tester 15 is connected to the interface circuit 25 via output lines 118.

Certain data concerning operation of the prober 11 is read from the CPU 28 into the tester 15 in response to a read signal applied to the interface circuit 25 via read bus 67 which then activates the bidirectional bus driver 55 for reading the data onto the internal bus 54. This data on the internal bus 54 is thence inputted to a latch 119, such as a 74LS374 commercially available from Texas Instruments. The data on the internal bus is latched into the latch 119 in response to a write signal appearing on line 121 received from the write decoder 68. The output data of the latch 119 is fed back to the tester 15 and includes information such as the X and Y (row and column) information relative to the die under test, whether the wafer prober is probing to the left or back or whether the chuck is in the up position or whether an edge of the wafer has been sensed.

Power is supplied to the tester interface circuit 25 via a pair of input terminals 123. An interface circuit ground is provided on terminals 124. A pair of read output address signals are provided on output terminals 125 and a pair of write output address signals are provided on a pair of output terminals 126.

The CPU 28, in a preferred embodiment, conmprises a model 8080 microprocessor commercially available from Intel of Santa Clara, Calif. The CPU 28 is programmed with a program as shown in appendix I below and the program has a logic flow diagram as shown in FIG. 9.

The advantage of the present invention is that a plurality of different die testers 15 can be interfaced to a wafer prober 11 by merely selecting the proper front panel switch positions, thereby greatly simplifying the interface procedure for the operator.

APPENDIX I

```
PL/M-80 COMPILER
ISIS-II PL/M-80 V3.1 COMPILATION OF MODULE PROBE2
OBJECT MODULE PLACED IN :F1:P2SRC.OBJ
COMPILER INVOKED BY: PLM80 :F1:P2SRC
SYMBOLS DEBUG XREF
  8    1      DCL RTIC(32) BYTE; /*
                DATA FROM TIC RCM */
  9    1      DCL TICADD ADD; /*
                POINTER TC ACTIVE TIC */
 10    1      DCL (TIC BASED TICADD)(32) BYTE;
 25    1      DCL
              CLEAR      LIT '0',
              FALSE      LIT '0',
              TRUE       LIT 'OFFH',
              TSTRT      LIT '20H',
              /********I/O ASSIGNMENTS***********/
              /***********OUTPUT PORTS***********/
              TESTMSK    LIT '16',
              TESTOUT    LIT 'OUT(TESTMSK)',
              INVERT     LIT '18',
              CMDMSK     LIT '19',
              ROMADD     LIT '20',
              /* 21 TO 35 ARE NOT USED */
              /* 38 TO DFH ARE NOT USED */
              INKCMD     LIT '16',
              TICON      LIT '19',
              ECOSX      LIT '(NOT(SHR(IN(TICON),
                         1))AND 7)',
              ROMDATA    LIT '20',
              I BYTE,
              START BYTE,
              START$SW BYTE,
              TEST$COMPL BYTE PUB,
              TESTING BYTE PUB,
              TICID BYTE,
              TICPULSE BYTE,
 32    1      DCL DTIC(32) BYTE DATA(0,50H,5FH,5FH,5FH,
              5FH,5FH,5FH,5FH,11H,1AH,23H,12H,24H,55H,
              CE9H,1FH,4CH,21H,53H,97H,1FH,1FH,1FH,
              1FH,1FH,1FH,1FH,1FH,1FH,1FH,1FH,);
              /* REMOTE KEYBOARD MESSAGES */
361    1  =   TEST$START: PROC ;
362    2  =      TESTCOMPL=FALSE;
363    2  =      TESTOUT=1;
364    2  =      TESTING=TRUE;
365    2  =      IF TICPULSE=0 THEN RETURN;
367    2  =      CALL TIME(TICPULSE*10);
368    2  =      TESTOUT=CLEAR;
369    2  =      RETURN;
370    2  =   END TEST$START;
1356   1      AUTO$ROUTINE: PROC ;
1370   2         IF STEPPER$BUSY THEN RETURN;
1416   2         IF NOT RUNNING THEN
1417   2         DO;
1421   4            START=FALSE;
1422   4            TESTING=FALSE;
1424   4            TEST$COMPL=FALSE;
1428   4            OUT(ROMADD)=0;
1429   4            IF ((IN(ROMDATA)=0) OR
                       (IN(ROMDATA)=OFFH)) THEN
                       TICADD=.CTIC
1431   4            ELSE IF TICID<>IN(ROMDATA)
1432   4            THEN DO;
1433   5               TICID=IN(ROMDATA);
1434   5               TICADD=.RTIC;
1435   5               DO I=0 TO 31;
1436   6                  CUT(ROMADD)=I;
1437   6                  RTIC(I)=IN(ROMDATA);
1438   6               END;
1439   5            END;
                    AUTOREADY=TRUE;
1441   4            RETURN;
1442   4         END;
```

APPENDIX I-continued

```
1443   3            I=ECOSX+1;
1444   3            TICPULSE=SHR(TIC(I),4) AND OFH;
1445   3            OUT(INVERT)=TIC(I) AND OFH;
1615   5            IF TEST$COMPL THEN
1616   5            DO;
1635   6               TESTING=FALSE;
1636   6               TESTCOMPL=FALSE;
1666   6               CALL START$TAGEDWN;
1667   6               CALL STEPMX;
1677   6               CALL TEST$START;
1680   6               RETURN;
1738   2            END AUTO$ROUTINE;
PL/M-80 COMPILER
ISIS-II PL/M-80 V3.1 COMPILATION OF
MODULE P2MOD1
OBJECT MODULE PLACED IN :F1:P2MOD.OBJ
COMPILER INVOKED BY: PLM80 :F1:P2MOD SYMBOLS
DEBUG XREF
 436   1         INT1:PROC INTERRUPT 1;
                 /*EOT*/
 444   2         IF TESTING THEN
 446   3         TEST$COMPL=TRUE;
 449   3         END;
                 CUT(TESTMSK)=0;
 451   2         END INT1;
```

What is claimed is:

1. In a method for interfacing an automatic wafer prober with any one of a number of different die testers for probing and testing circuit die on a semiconductor wafer and for correlating the results of the test with respective tested die on the wafer, the steps of;

storing in memory associated with the wafer prober a plurality of sets of data there being one set of data for each of a plurality of different die testers, each set of data defining the sense of a plurality of test result output signals derived from the particular die tester to be interfaced to the prober after test of the respective die under test;

selecting the particular set of stored data corresponding to the particular die tester to be interfaced to the wafer prober; and employing the selected set of data for modifying the sense of the test result output signals derived from the die tester after test of a respective die under test as fed into the wafer prober so that the sense of the die tester result output signals as fed into the wafer prober are the same for any one of the plurality of different die testers.

2. The method of claim 1 including storing in memory associated with the wafer prober a plurality of sets of data, there being one set of data for each of a plurality of die testers, each set of data defining the test start pulse width to be supplied from the wafer prober to a particular die tester to initiate test of a particular die on the wafer being probed; and selecting the particular set of stored data determinative of the pulse width of the test start signal for the particular die tester to be interfaced to the wafer prober; and employing the selected set of pulse width determinative data for determining the pulse width of the test start signal fed from the wafer prober to the die tester to initiate test of the die.

3. In an apparatus for interfacing an automatic wafer prober with any one of a number of different die testers for probing and testing circuit dies on a semiconductive wafer and for correlating results of the test with respective tested die on the wafer;

means for storing in memory associated with the wafer prober a plurality of sets of data, there being one set of data for each of a plurality of different die testers, each set of data defining the sense of a plurality of test result output signals derived from the particular die tester to be fed into and interfaced with the prober after test of a respective die under test;

means for selecting the particular set of stored data corresponding to the particular die tester to be interfaced to the wafer prober; and means for employing the selected set of data for modifying the sense of the test result output signals derived from the die tester after test of a respective die under test as fed into the wafer prober so that the sense of the die tester output signals as fed into the wafer prober are the same for any one of a plurality of different die testers.

4. The apparatus of claim 3 wherein said means for storing in memory associated with the wafer prober a plurality of sets of data includes storing a set of data representative of the test start pulse width to be supplied from the wafer prober to the particular die tester to initiate test of a particular die on the wafer being probed; and wherein said means for employing the selected set of data includes means for employing the set of pulse width data for determining the pulse width of the test start signal fed from the wafer prober to the die tester to initiate the test of the die.

* * * * *